(12) United States Patent
Cardineau et al.

(10) Patent No.: US 12,129,271 B2
(45) Date of Patent: Oct. 29, 2024

(54) ORGANOTIN CLUSTERS, SOLUTIONS OF ORGANOTIN CLUSTERS, AND APPLICATION TO HIGH RESOLUTION PATTERNING

(71) Applicant: Inpria Corporation, Corvallis, OR (US)

(72) Inventors: Brian J. Cardineau, Corvallis, OR (US); Stephen T. Meyers, Corvallis, OR (US); Kai Jiang, Corvallis, OR (US); William Earley, Corvallis, OR (US); Jeremy T. Anderson, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 126 days.

(21) Appl. No.: 17/380,475

(22) Filed: Jul. 20, 2021

(65) Prior Publication Data

US 2021/0347791 A1    Nov. 11, 2021

Related U.S. Application Data

(63) Continuation of application No. 16/194,491, filed on Nov. 19, 2018, now Pat. No. 11,098,070.

(60) Provisional application No. 62/588,546, filed on Nov. 20, 2017.

(51) Int. Cl.
*C07F 7/22*     (2006.01)
*G03F 7/004*    (2006.01)
*G03F 7/20*     (2006.01)
*G03F 7/32*     (2006.01)

(52) U.S. Cl.
CPC .......... *C07F 7/2224* (2013.01); *G03F 7/0042* (2013.01); *G03F 7/2004* (2013.01); *G03F 7/325* (2013.01); *C07B 2200/13* (2013.01)

(58) Field of Classification Search
None
See application file for complete search history.

(56) References Cited

U.S. PATENT DOCUMENTS

| | | |
|---|---|---|
| 9,310,684 B2 | 4/2016 | Meyers et al. |
| 10,228,618 B2 | 3/2019 | Meyers et al. |
| 10,642,153 B2 | 5/2020 | Meyers et al. |
| 10,787,466 B2 * | 9/2020 | Edson .............. C07F 7/2224 |
| 10,975,109 B2 * | 4/2021 | Edson .............. C07F 7/2284 |
| 11,098,070 B2 * | 8/2021 | Cardineau ............. G03F 7/325 |
| 11,392,028 B2 * | 7/2022 | Cardineau ............. C07F 7/2224 |
| 2016/0116839 A1 * | 4/2016 | Meyers .............. G03F 7/325 430/326 |
| 2017/0102612 A1 | 4/2017 | Meyers et al. |
| 2017/0146909 A1 | 5/2017 | Smith et al. |
| 2017/0256418 A1 | 7/2017 | Chang et al. |
| 2019/0137870 A1 | 5/2019 | Meyers et al. |
| 2019/0153001 A1 * | 5/2019 | Cardineau .............. G03F 7/0042 |
| 2019/0308998 A1 * | 10/2019 | Cardineau .............. G03F 7/0042 |
| 2019/0369489 A1 | 12/2019 | Meyers et al. |
| 2020/0064733 A1 | 2/2020 | Meyers et al. |
| 2022/0064192 A1 * | 3/2022 | Edson .................. C07F 7/2208 |
| 2022/0324886 A1 * | 10/2022 | Cardineau .............. C07F 7/2224 |
| 2023/0143592 A1 * | 5/2023 | Jiang ..................... G03F 7/0048 430/270.1 |

FOREIGN PATENT DOCUMENTS

| | | |
|---|---|---|
| RU | 2317993 C1 * | 2/2008 |
| WO | 2017-006319 A1 | 1/2017 |

OTHER PUBLICATIONS

International Union of Pure and Applied Chemistry, Compendium of Chemical Terminology (IUPAC), Gold Book, p. 694-695 of 1622 (2012) (Year: 2012).*
International Union of Pure and Applied Chemistry, Compendium of Chemical Terminology (IUPAC), Gold Book, p. 1474 of 1622 (2012) ("Gold Book") (Year: 2012).*
Cardineau et al., "Photolithographic properties of tin-oxo clusters using extreme ultraviolet light (13.5 nm)", Microelectronic Engineering, Apr. 24, 2014 (E-pub.), vol. 127, pp. 44-50.
Chandrasekhar et al., "Organotin assemblies containing Sn—O bonds," Coordination Chemistry Reviews, 2002, vol. 235, 1-52.
Chandrasekhar et al., "Organotin Cages, {[(n-BuSn)3(μ3-O)(OC6H4-4-X)3]2(HPO3]4}, X=H, Cl, Br, and I, in Double O-Capped Structures: Halogen-Bonding-Mediated Supramolecular Formation," Organometallics 2005, vol. 24, 4926-4932. (Abstract).
Corey et al., "Preparation of trans-1,2-Bis (tri-n-butylstannyl) ethylene", The Journal of Organic Chemistry, Dec. 1, 1975, vol. 40, No. 25, pp. 3788-3789.
Dakternieks et al., "Synthesis, structure and reactions of [(BuSn)12O14(OH)6]Cl2•2H2O: solution studies using 119Sn NMR and electrospray mass spectrometry", Journal of Organometallic Chemistry, Aug. 9, 1994, vol. 476, No. 1, pp. 33-40.
Day et al., "A New Structural Form of Tin in an Oxygen-Capped Cluster", J. Am. Chem. Soc. 1987, vol. 109, 940-941.

(Continued)

*Primary Examiner* — Alexander R Pagano
(74) *Attorney, Agent, or Firm* — Christensen, Fonder, Dardi PLLC; Peter S. Dardi; Diane E. Bennett

(57) ABSTRACT

Organotin clusters are described with the formula $R_3Sn_3(O_2CR')_{5-x}(OH)_{2+x}(\mu_3-O)$ with $0 \leq x < 2$; R=branched or cycloalkyl with 1 to 31 carbon atoms; R'=H or alkyl with 1 to 20 carbon atoms. Three carboxylato ligands are bridging, and two OH ligands are bridging. The remaining two carboxylato ligands are in non-bridging configurations, and the non-bridging carboxylato ligands are exchangeable in solution. Solutions of these clusters are suitable for forming radiation sensitive coatings that can be used to pattern nanometer scale structures. The radiation sensitive coatings are particularly suitable for EUV patterning.

11 Claims, 9 Drawing Sheets

(56) References Cited

OTHER PUBLICATIONS

Eyechenne-Baron et al., "New synthesis of the nanobuilding block {(BuSn)12O14(OH)6}2+ and exchange properties of {(BuSn)12O14(OH)6} (O3SC6H4CH3)2," J. Organometallic Chemistry 1998, 567, 137-142.

Mack, C. "Fundamental Principles of Optical Lithography", John Wiley & Sons, Chichester, U.K; pp. 271-272, 2007. (Abstract).

Puff et al., "Zur hydrolyse von monoorganylzinn-trihalogeniden (III. Isolierung und Röntgenstrukturanalyse von Verbindungen mit dem nueartigen Käfig-ion [(i-PrSn)12O14(OH)6+2]", J. Organometallic Chemistry 1989, 373, 173-184.

Renaldo et al., "Palladium-Catalyzed Coupling of Acid Chlorides With Organotin Reagents: Ethyl (E)-4-(4-Nitrophenyl)-4-OXO-2-Butenoate", Organic Syntheses, 1989, vol. 67, p. 86. internal pp. 1-8.

Reuter et al., "On the structural diversity anions coordinate to the butterfly-shaped [(R2Sn)3O(OH)2]2+ cations and vice versa", Canadian Journal of Chemistry, vol. 92, pp. 496-507, (Jan. 2014).

Schumann et al., "Synthesis and characterization of some organo-all-tin dendrimers with different peripheral substituents", Journal of Organometallic Chemistry 691, p. 1703-1712, (2006).

International Standard ISO 21348 (2007) (Abstract Only).

International Search Report and Written Opinion for International Application No. PCT/US2018/061769 dated Jun. 17, 2019.

Office Action from corresponding Taiwan Application No. 107141012 dated Jun. 17, 2020.

Kuan et al., "Hexameric isopropyloxotin acetate chloroform tetrasolvate", Acta Crystallographica, Section E: Structure Reports Online, vol. 58 No. 6, p. m301-m303, (2002).

Nagabrahmanandachari et al., "Reaction of n-butyltin dihydroxy chloride with carboxylic and phosphinic acids: crystal structures of the ladder [{Sn(n-Bu)(O2CCHPh2)}3Cl2O2]2 and the unsolvated cluster [{Sn(n-Bu)(O2PPH2)Cl2} {Sn(n-Bu)(O2PPh2)2(OH)}]2", Main Group Chemistry, vol. 21 No. 12, p. 789-802, (Dec. 1, 1998).

Prabusankar et al., "Sn3 and Sn10 sulfonate-oxide-hydroxide clusters with two different sulfonate binding modes", Dalton Transactions, vol. 29, p. 3121-3123, (2007).

Schmid et al., "Oxygen- and sulfur-capped organotin clusters", Phosphorus, Sulfur and Silicon and the Related Elements, vol. 41 No. 1-2, p. 69-74, (1989).

Office Action from corresponding Japanese Patent Application No. 2020-527805 dated Jun. 7, 2022.

\* cited by examiner

ORGANOTIN CLUSTERS, SOLUTIONS OF ORGANOTIN CLUSTERS, AND APPLICATION TO HIGH RESOLUTION PATTERNING

CROSS REFERENCE TO RELATED APPLICATIONS

This application is a continuation of copending U.S. patent application Ser. No. 16/194,491 filed Nov. 19, 2018 (published as US2019/0153001) to Cardineau et al., entitled "Organotin Clusters, Solutions of Organotin Clusters, and Application to High Resolution Patterning," which claims priority to U.S. Provisional Patent Application 62/588,546 filed on Nov. 20, 2017 to Cardineau et al., entitled "Organometallic Metal Clusters and Application to High Resolution Patterning," both of which are incorporated herein by reference.

FIELD OF THE INVENTION

The invention relates to organometallic radiation sensitive patterning resist compositions and methods to form resist patterns using the composition, in which the compositions can comprise organometallic clusters. The invention further relates to precursor solutions comprising organometallic clusters and to methods for synthesizing organometallic clusters. Coatings formed with the organometallic clusters can be patterned with radiation to produce structures at low exposure doses.

BACKGROUND OF THE INVENTION

The processing of semiconductor circuits and devices has involved the continued shrinkage of critical dimensions over each generation. As these dimensions shrink, new materials and methods can be called upon to meet the demands of processing and patterning smaller and smaller features. Patterning generally involves selective exposure of a thin layer of a radiation sensitive material (resist) to form a pattern that is then transferred into subsequent layers or functional materials. Promising new classes of metal-based radiation resists have been discovered that are especially suitable for providing good absorption of extreme ultraviolet light (EUV) and electron beam radiation, while simultaneously providing very high etch contrast. To obtain smaller patterned features, EUV has been tracked to become a significant tool in semiconductor processing, and resist compositions able to exploit the EUV advantages can be a valuable component to this effort.

SUMMARY OF THE INVENTION

In a first aspect, the invention pertains to a composition comprising molecular clusters represented by the formula $R_3Sn_3(O_2CR')_{3+x}(L)_{2-x}(OH)_2(\mu_3-O)$ with $0 \leq x < 2$; L is a ligand with the formula $OR_a$ or $SR_a$, where $R_a$ is H or an organo group with 1 to 20 carbon atoms; R=branched or cycloalkyl with 1 to 31 carbon atoms; R'=H or alkyl with 1 to 20 carbon atoms.

In a further aspect, the invention pertains to a solution comprising an organic solvent and solvated organometallic clusters with the formula $R_3Sn_3(O_2CR')_{5-x}(L)_{2+x}(\mu_3-O)$ with $0 \leq x < 2$; R=branched or cycloalkyl with 1 to 31 carbon atoms; R'=H or alkyl with 1 to 20 carbon atoms, and L is a ligand with the formula —OR", wherein R" is H, an organo group or a combination thereof.

In another aspect, the invention pertains to a method for patterning a structure comprising the step of exposing a substrate with a radiation sensitive coating to patterned radiation to form an exposed coating with a latent image, and the step of developing the exposed coating with a suitable developing agent to form a patterned coating. The radiation sensitive coating generally formed through the deposition of a solution comprising molecular clusters represented by the formula $R_3Sn_3(O_2CR')_{5-x}(L)_{2+x}(\mu_3-O)$ with $0 \leq x < 2$; R=branched or cycloalkyl with 1 to 31 carbon atoms, R'=H or alkyl with 1 to 20 carbon atoms, and L is a ligand with the formula —OR", wherein R" is an organo group.

DETAILED DESCRIPTION OF THE INVENTION

Figure 1:
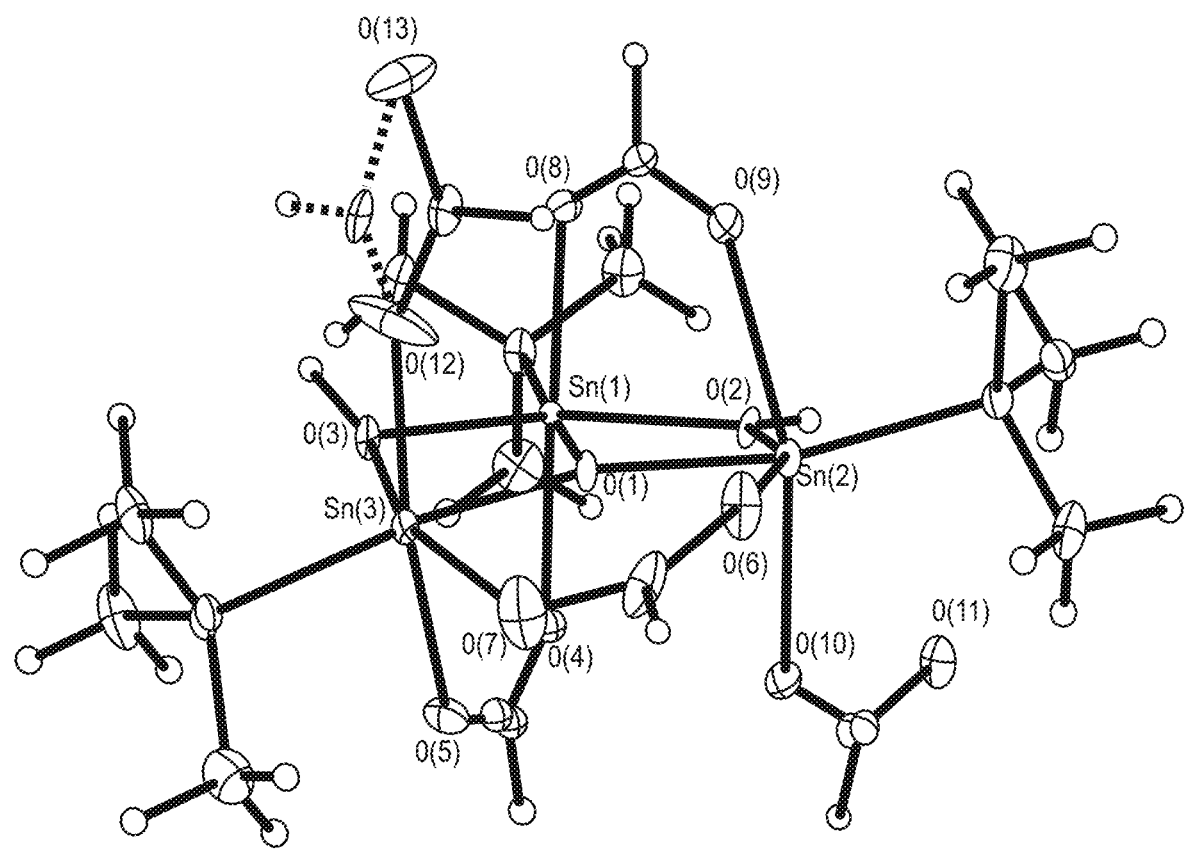
FIG. 1 is a ball and stick image of the three dimensional structure of crystalline tin trimer, $((CH_3)_3C)_3Sn_3(O_2CH)_5(\mu_3-O)$ obtained from an x-ray diffraction and analysis of the diffractogram.

Organotin clusters, comprising generally three Sn atoms with alkyl ligands as well as bridging carboxylato ligands, bridging hydroxo ligands, and a bridging oxo ligand have been synthesized that provide for alternative processing characteristics that may be advantageous for radiation based patterning applications. The clusters have three tin atoms with one alkyl ligand for each tin atom. In some embodiments, the clusters have one oxygen atom bridging between the three metal atoms ($\mu_3$-O) along with 3-5 carboxylato ligands and 4-2 hydroxo ligands, in which 2 ligands can be interchanged between carboxylato and hydroxo ligands. The tin-alkyl and tin-carboxylato bonds are sensitive to scission, such as with radiation exposure. This bond rupture creates a chemical contrast that enables the desired radiation based patterning. Synthesis of the tin clusters is based on precursor acetylide ligands in which reaction with selected amounts of carboxylic acid and water drive the cluster formation with corresponding formation of the corresponding carboxylato, hydroxo and oxo ligands. Nonaqueous solutions formed with the clusters provide coating compositions that are promising with respect to improved precursor solubility, coating quality, and sensitivity relative to other radiation-based organometallic patterning materials.

Alkyl metal coordination compositions have been found to provide desirable patterning properties with high energy radiation to enable patterning of very fine features. These compositions are particularly effective for patterning with e-beam or EUV radiation. The use of alkyl substituted metal coordination compounds in high performance radiation based patterning compositions is described, for example, in U.S. Pat. No. 9,310,684 to Meyers et al., entitled "Organometallic Solution Based High Resolution Patterning Compositions," incorporated herein by reference. Refinements of these organometallic compositions for patterning are described in published U.S. patent applications 2016/0116839 A1 to Meyers et al., entitled "Organometallic Solution Based High Resolution Patterning Compositions and Corresponding Methods," and 2017/0102612 A1 to Meyers et al., entitled "Organotin Oxide Hydroxide Patterning Compositions, Precursors, and Patterning," both of which are incorporated herein by reference. The organometallic compositions in these references have structures based on single metal moieties which can be condensed into a metal oxo-hydroxo material during processing.

The metal clusters with three metal atoms and organic ligands described herein comprise bridging groups between two or three metal atoms. The metal cluster compositions are crystalline solids as synthesized, and the structure has been determined for a representative embodiment. The metal cluster compositions are soluble in appropriate organic solvents for additional processing. Solutions of the metal clusters can be used as a radiation resist that can be deposited on a suitable substrate and further processed for patterning. As demonstrated herein, the metal cluster based compositions can be effectively used for patterning and have likely processing advantages.

The tin clusters of current interest comprise a core of three tin atoms with a $\mu_3$ central bridging oxygen atom connecting the three tin atoms. Each tin has an alkyl ligand. Three bridging ($\mu_2$) carboxylate ligands connect each pair of tin atoms. An additional two carboxylato ligands are bound to two tin atoms in an unbridged (Sn—O bonded) configuration, and the tin atom without an unbridged carboxylate ligand is bound to two $\mu_2$ hydroxo ligands bridging it to each of the other two tin atoms. Thus, two of the tin atoms have equivalent ligand structures and the third tin atom has a somewhat different ligand structure, although all of the tin atoms have alkyl ligands (Sn—C bonded) and share two bridging carboxylato ligands. It is believed based on the results in the Examples below that the two unbridged carboxylato ligands can be readily substituted with unbridged hydroxo ligands and/or alkoxide ligands (Sn—O bonded). As described in detail below, the synthesis involves the reaction of alkyl tin tri(alkylacetylide) with a carboxylic acid and water in a polar organic solvent.

Formation of some tin clusters have been described based on the reaction of alkyl stannoic acids, RSn(O)OH. The formation of tin trimers with phosphate ligands are described in Day et al., J. Am. Chem. Soc. 1987, Vol. 109, 940-941, entitled "A New Structural Form of Tin in an Oxygen-Capped Cluster," incorporated herein by reference. Other organotin cages are described in Chandrasekhar et al., Organometallics 2005, Vol. 24, 4926-4932, entitled "Organotin Cages, $\{[(n\text{-}BuSn)_3(\mu_3\text{-}O)(OC_6H_4\text{-}4\text{-}X)_3]_2(HPO_3]_4\}$, X=H, Cl, Br, and I, in Double O-Capped Structures: Halogen-Bonding-Mediated Supramolecular Formation," incorporated herein by reference. Additional synthesis methods based on alkyl stannoic acid are summarized in a review by Chandrasekhar et al., Coordination Chemistry Reviews, 2002, Vol. 235, 1-52, entitled "Organotin assemblies containing Sn—O bonds," incorporated herein by reference. This synthesis work based on alkyl stannoic acid does not suggest the synthesis methods described herein or the specific ranges of compositions described herein.

The metal cluster compounds form a crystalline solid following purification, such as with re-crystallization. The solid composition can be dissolved in suitable solvents, optionally with an amount of carboxylic acid for stabilization, at room temperature, and the resulting solutions are suitable as resist precursor compositions. The resist precursor compositions can be stable in solution for distribution of patterning applications. As exemplified below, the precursor compositions can be used for coating a substrate to be patterned. Suitable processing during and post coating can prepare the coated substrate for radiation patterning. The results below demonstrate that the resulting coated substrate is suitable for EUV patterning of nanometer scale features.

The tin cluster compositions herein can be represented by the formula $R_3Sn_3(O_2CR')_{5-x}(OH)_{2+x}$ ($\mu_3$-O) with $0 \leq x < 2$; R=branched or cycloalkyl with 1 to 31 carbon atoms; R'=H or alkyl with 1 to 31 carbon atoms. The tin clusters have three tin atoms around a $\mu_3$ oxygen atom, where $\mu_3$ indicates the three fold bonding configuration. Of the five carboxylato ligands, three are bridging ($\mu_2$) and two are non-bridging. The $\mu$ notation is not necessarily included in the formulas for convenience. The R group can be a linear, branched (including secondary or tertiary at the metal-bonded carbon atom), or cyclic hydrocarbyl group.

Each R (alkyl) group is bound to the tin atom individually and generally has from 1 to 31 carbon atoms, with 3 to 31 carbon atoms for a group with a secondary-bonded carbon atom and 4 to 31 carbon atoms for a group with a tertiary-bonded carbon atom, although in some embodiments each R group can have no more than 20 carbon atoms, and in further embodiments no more than 15 carbon atoms. A person of ordinary skill in the art will recognize that additional ranges of carbon numbers within the explicit ranges above are contemplated and are within the present disclosure. In particular, branched alkyl ligands can be desirable for some patterning compositions where the R—Sn portion of the cluster can be represented as $R^1R^2R^3CSn$, where $R^1$ and $R^2$ are independently an alkyl group with 1-10 carbon atoms, and $R^3$ is hydrogen or an alkyl group with 1-10 carbon atoms. In some embodiments $R^1$ and $R^2$ can form a cyclic alkyl moiety, and $R^3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is —$CH_2CH_3$), sec-butyl ($R^1$ is methyl, $R^2$ is —$CH_2CH_3$, and $R^3$ is hydrogen), neopentyl ($R^1$ and $R^2$ are hydrogen, and $R^3$ is —$C(CH_3)_3$), cyclohexyl, cyclopentyl, cyclobutyl, and cyclopropyl. Examples of suitable cyclic groups include, for example, 1-adamantyl (—$C(CH_2)_3(CH)_3(CH_2)_3$ or tricyclo(3.3.1.13,7) decane bonded to the metal at a tertiary carbon) and 2-adamantyl (—$CH(CH)_2(CH_2)_4(CH)_2$ ($CH_2$) or tricyclo(3.3.1.13,7) decane bonded to the metal at a secondary carbon). In other embodiments hydrocarbyl groups may include aryl or alkenyl groups, for example, benzyl or allyl, or alkynyl groups. In other embodiments the hydrocarbyl ligand R may include any group consisting solely of C and H and containing 1-31 carbon atoms. For example: linear or branched alkyl (i-Pr (($CH_3)_2$CH—), t-Bu (($CH_3)_3$C—), Me ($CH_3$—), n-Bu ($CH_3CH_2CH_2CH_2$—)), cyclo-alkyl (cyclo-propyl, cyclobutyl, cyclo-pentyl), olefinic (alkenyl, aryl, allylic), or alkynyl groups, or combinations thereof. In further embodiments suitable R groups may include hydrocarbyl groups substituted with hetero-atom functional groups including cyano, thio, silyl, ether, keto, ester, or halogenated groups, or combinations thereof.

With respect to the carboxylato ligands $O_2CR'$, formate ligands ($O_2CH$, $R'=CH_3$) are exemplified below. In general, R' can be straight chained or branched, with up to 20 carbon atoms, in further embodiments up to 12 carbon atoms and in other embodiments no more than 10 carbon atoms. A person of ordinary skill in the art will recognize that additional ranges of carbon atoms within the explicit ranges above are contemplated and are within the present disclosure. Other particularly suitable carboxylate (alternatively referred to as carboxylato) ligands include, for example, acetate ligands ($O_2CCH_3$), propionate ligands ($O_2CCH_2CH_3$), oxalate ligands ($O_2CCO_2H$), or combinations thereof.

Three carboxylate ligands are bridging ($\mu_2$) with Sn—O—CR'—O—Sn structures that are believed to stabilize the structure. Two carboxylate ligands are non-bridging, and it is believed that these are exchangeable, e.g., with hydroxo (OH) ligands or alkoxide ligands. Thus, the parameter x in the formula indicates a degree of exchange of non-branched carboxylate ligands with hydroxide ligands. Alkoxide ligands can be represented by the formula $OR_a$, where $R_a$ is an organo group generally with 1 to 20 carbon atoms. An organo group refers to an organic moiety, such as an aklyl groups or cycloalkyl groups that are more generally saturated or unsaturated (alkenyl, alkynyl or aromatic) as well as substituted or unsubstituted with hetero atoms. Other low $pK_a$ ligands may also be suitable for substitution for the non-bridging carboxylate ligands, such as ligands to the carbonyl O of a carbonyl amide, carbamate, or an S of a thiol. Thus, the formula of the tin trimer generalizes based on these substitutions to $R_3Sn_3(O_2CR')_{3+x}(OH)_2(L)_{2-x}$ ($\mu_3$-O) with $0 \le x < 2$, where L represents a ligand with the formula $OR_a$ or $SR_a$, where $R_a$ is H or an organo group with 1 to 20 carbon atoms. The structure of the clusters, as synthesized, is determined in the purified crystalline form, although it may be possible to form the solid in an amorphous form. It is believed that the core cluster structure is maintained in solution, although the solvent may provide exchangeable ligands, such as water or alcohol. If the cluster compositions are dissolved in an alcohol solvent, it is possible that alkoxide ligands may substitute at least in part for the non-bridging carboxylate ligands and/or the hydroxide ligands. If the solution is formed into a thin coating under ambient atmosphere or if the solvents include amounts of water, the carboxylate ligands may be replaced by hydroxide ligands due to exposure with atmospheric water or water from the solvent.

The synthesis of the tin clusters can be based on the use of an initial tin reactant alkyltin triacetylide, $RSn(C \equiv CR'')_3$, where R corresponds with the alkyl group specified above for the alkyl ligands in the clusters. R" generally can be a linear or branched alkyl group and can be cyclic, unsaturated, or aromatic. R" is a phenyl group in the Examples. The alkyltin acetylide can be synthesized by addition of acetylide anion ($R'C \equiv C^-$) to the $RSnCl_3$, addition of alkyl anion to $Sn(C \equiv CR'')_4$ or reaction of $HC \equiv CR''$ with $RSn(NR'''_2)_3$. The alkyltin triacetylide is reacted with a carboxylic acid and a small amount of water in a polar solvent. In general, the solvent can be an alcohol, such as ethanol, or other water miscible organic solvent. The amount of carboxylic acid and water is selected to provide for the trimer cluster formation. Generally, the molar ratio of carboxylic acid to water is from about 3 to about 18, in further embodiments from about 5 to about 15 and in other embodiments from about 7 to about 14. A person of ordinary skill in the art will recognize that additional ranges of ratios of carboxylic acid to water within the explicit ranges above are contemplated and are within the present disclosure.

To perform the reaction, heat can be applied to speed dissolving of the alkyltin triacetylide. In the Examples below, the solution is heated to 60° C. for 10 minutes to dissolve the reactants. The temperature can be selected to a desired value below the solvent boiling point and the amount of time can be selected based on the dissolving of the reactants. The temperature of the heating step does not seem significant for the cluster formation. The reaction to form the clusters can be performed overnight, although longer or shorter time can be appropriate. Generally, the reaction to form the clusters can be performed for at least about 30 minutes, in further embodiments at least about an hour, and in other embodiments from about 90 minutes to about 2 days. A person of ordinary skill in the art will recognize that additional ranges within the explicit ranges above are contemplated and are within the present disclosure. The reaction can be performed at room temperature, although some heating or cooling can be used if desired.

The product can be collected by evaporating the solvent, which is generally performed under reduced pressure to allow for a lower temperature. The collected solid can be recrystallized for purification, generally from an organic solvent through heating of the solvent to dissolve the composition and slowly allowing the solution to cool. Suitable solvents for recrystallization include, for example, toluene, acetonitrile, ethanol, methanol, acetone, or the like. The recrystallized composition can be collected for further use and optionally washed with a suitable solvent. Based on the experiments, at least some exchange of non-bridged carboxylato ligands may exchange for alkoxy ligands during recrystallization in alcohol solvents.

To form a resist precursor solution, the cluster composition can be dissolved in a suitable organic solvent. Solubility has been found in chloroform, alcohols and a range of polar organic solvents with formic acid or other carboxylic acid as a stabilizer in concentrations of about 1%-25% v/v and in further embodiments from about 5% to 20% v/v, which is the added volume per total volume of the mixture. Alcohols may be one or more of 1-methoxy-2-propanol, 4-methyl-2- pentanol, cyclopentanol, methanol, ethanol, n-propanol, or isopropanol, mixtures thereof or the like. The alkyltin trimer composition also dissolves in mixed formic acid solutions with one or more of polar ethers, such as tert-butyl methyl ether and anisole, ethyl lactate, cyclic ethers, such as tetrahydrofuran, or the like. Other organic solvents may also be suitable based on the identified solvents noted above. Tin concentrations can be in the range of about 0.1 mM to about 1 M, in further embodiments from about 0.5 mM to about 500 mM, and in other embodiments from about 1 mM to about 100 mM by amount of tin. In general, organic solvent selection can be influenced by solubility parameters, volatility, flammability, toxicity, viscosity and potential chemical interactions with other processing materials. Generally, an amount of added carboxylic acid can correspond to the acid form of the carboxylate ligands. Thus, for the exemplified clusters, formic acid would be added to the solution. A person of ordinary skill in the art will recognize that additional ranges of concentrations within the explicit ranges above are contemplated and are within the present disclosure. In general, precursor solutions can be well mixed using appropriate mixing apparatuses suitable for the volume of material being formed. Suitable filtration can be used to remove any contaminants or other components that do not appropriately dissolve.

In solution, as noted above, the two non-bridging carboxylate ligands can be replaced by other ligands such as alkoxide or sulfur analogs. Thus, the formula for the clusters becomes $R_3Sn_3(O_2CR')_{3+x}(OH)_2(L)_{2-x}$ ($\mu_3$-O) with $0 \leq x < 2$, where L is $OR_a$ or $SR_a$, where $R_a$ is specified above. While the substituted tin trimer clusters may be formed in solution, the solvent can be removed to form the corresponding solids.

A coating material can be formed through deposition and subsequent processing of the precursor solution onto a selected substrate. Using the precursor solutions described herein, some hydrolysis and condensation generally may take place during coating, and may be completed or furthered post coating via subsequent processing steps such as heating in air. A substrate generally presents a surface onto which the coating material can be deposited, and the substrate may comprise a plurality of layers in which the surface relates to an upper most layer. In some embodiments, the substrate surface can be treated to prepare the surface for adhesion of the coating material. Also, the surface can be cleaned and/or smoothed as appropriate. Suitable substrate surfaces can comprise any reasonable material. Some substrates of particular interest include, for example, silicon wafers, silica substrates, other inorganic materials such as ceramic materials, polymer substrates, such as organic polymers, composites thereof and combinations thereof across a surface and/or in layers of the substrate. Wafers, such as relatively thin cylindrical structures, can be convenient, although any reasonable shaped structure can be used. Polymer substrates or substrates with polymer layers on non-polymer structures can be desirable for certain applications based on their low cost and flexibility, and suitable polymers can be selected based on the relatively low processing temperatures that can be used for the processing of the patternable materials described herein. Suitable polymers can include, for example, polycarbonates, polyimides, polyesters, polyalkenes, copolymers thereof and mixtures thereof. In general, it is desirable for the substrate to have a flat surface, especially for high resolution applications. However, in specific embodiments the substrate may possess substantial topography, where the resist coating is intended to fill or planarize features for particular patterning applications.

In general, any suitable solution coating process can be used to deliver the precursor solution to a substrate. Suitable coating approaches can include, for example, spin coating, spray coating, dip coating, knife edge coating, vapor deposition, such as chemical vapor deposition (CVD) or atomic layer deposition (ALD) methods, printing approaches, such as inkjet printing and screen printing, and the like. Some of these coating approaches form patterns of coating material during the coating process, although the resolution available currently from printing or the like has a significantly lower level of resolution than available from radiation based patterning as described herein.

If patterning is performed using radiation, spin coating can be a desirable approach to cover the substrate relatively uniformly, although there can be edge effects. In some embodiments, a wafer can be spun at rates from about 500 rpm to about 10,000 rpm, in further embodiments from about 1000 rpm to about 7500 rpm and in additional embodiments from about 2000 rpm to about 6000 rpm. The spinning speed can be adjusted to obtain a desired coating thickness. The spin coating can be performed for times from about 5 seconds to about 5 minutes and in further embodiments from about 15 seconds to about 2 minutes. An initial low speed spin, e.g. at 50 rpm to 250 rpm, can be used to perform an initial bulk spreading of the composition across the substrate. A back side rinse, edge bead removal step, or the like can be performed with water or other suitable solvent to remove any edge bead. A person or ordinary skill in the art will recognize that additional ranges of spin coating parameters within the explicit ranges above are contemplated and are within the present disclosure.

The thickness of the coating generally can be a function of the precursor solution concentration, viscosity, and the spin speed for spin coating. For other coating processes, the thickness can generally also be adjusted through the selection of the coating parameters. In some embodiments, it can be desirable to use a thin coating to facilitate formation of small and highly resolved features in the subsequent patterning process. For example, the coating materials after drying can have an average thickness of no more than about 10 microns, in other embodiments no more than about 1 micron, in further embodiments no more than about 250 nanometers (nm), in additional embodiments from about 1 nanometers (nm) to about 50 nm, in other embodiments from about 2 nm to about 40 nm and in some embodiments from about 3 nm to about 35 nm. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the film. In general, the coatings are relatively uniform to facilitate processing. In some embodiments, the variation in thickness of the coating varies by no more than ±50% from the average coating thickness, in further embodiments no more than ±40% and in additional embodiments no more than about ±25% relative to the average coating thickness. In some embodiments, such as high uniformity coatings on larger substrates, the evaluation of coating uniformity may be evaluated with a 1 centimeter edge exclusion, i.e., the coating uniformity is not evaluated for portions of the coating within 1 centimeter of the edge. A person of ordinary skill in the art will recognize that additional ranges within the explicit ranges above are contemplated and are within the present disclosure.

The coating process itself can result in the evaporation of a portion of the solvent since many coating processes form droplets or other forms of the coating material with larger surface areas and/or movement of the solution that stimulates evaporation. The loss of solvent tends to increase the viscosity of the coating material as the concentration of the species in the material increases. An objective during the coating process can be to remove sufficient solvent to stabilize the coating material for further processing. Reactive species may condense during coating or subsequent heating to forming a hydrolysate coating material.

In general, the coating material can be exposed to, and optionally heated in, the presence of atmospheric moisture prior to radiation exposure to hydrolyse the hydrolysable bonds to the metal in the precursor compositions, and/or further drive off solvent and promote densification of the coating material. The coating material following in situ hydrolysis may generally form a polymeric metal oxo-hydroxo and/or carboxylato network based on the binding of oxo-hydroxo and/or carboxylato ligands to the metals in which the metals also have some alkyl ligands, or a molecular solid comprised of polynuclear metal oxo/hydroxo and/or carboxylato species with alkyl ligands.

The hydrolysis/solvent removal process may or may not be quantitatively controlled with respect to precise stoichiometry of the heated coating material and/or specific amounts of solvent remaining in the coating material. Additionally, the formulas and compositions expressed herein may contain some additional water, whether directly bound to Sn, or as hydrogen-bonded component of the network. Empirical evaluation of the resulting coating material properties generally can be performed to select processing conditions that are effective for the patterning process. While heating may not be needed for successful application of the process, it can be desirable to heat the coated substrate to speed the processing and/or to increase the reproducibility of the process and/or to facilitate vaporization of the hydrolysis by products, such as amines and/or alcohols. In embodiments in which heat is applied to remove solvent in a pre-exposure bake, the coating material can be heated to temperatures from about 45° C. to about 250° C. and in further embodiments from about 55° C. to about 225° C. The heating for solvent removal can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of heating temperature and times within the explicit ranges above are contemplated and are within the present disclosure. As a result of the heat treatment, hydrolysis, and densification of the coating material, the coating material can exhibit an increase in index of refraction and in absorption of radiation without significant loss of contrast.

Following hydrolysis, condensation, and drying, the coating material can be finely patterned using radiation. As noted above, the composition of the precursor solution and thereby the corresponding coating material can be designed for sufficient absorption of a desired form of radiation, with a particular interest with respect to EUV radiation. The absorption of the radiation results in energy that can break the bonds between the metal and alkyl ligands so that at least some of the alkyl ligands are no longer available to stabilize the material. Similarly, absorption of the radiation can also break the bonds between the metal and carboxylate ligands and/or decompose the carboxylate ligands. Radiolysis products, including alkyl ligands or other fragments may diffuse out of the film, or not, depending on process variables and the identity of such products. With the absorption of a sufficient amount of radiation, the exposed coating material condenses, i.e. forms an enhanced metal oxo-hydroxo network, which may involve additional water absorbed from the ambient atmosphere. The radiation generally can be delivered according to a selected pattern. The radiation pattern is transferred to a corresponding pattern or latent image in the coating material with irradiated areas and un-irradiated areas. The irradiated areas comprise chemically altered coating material, and the un-irradiated areas comprise generally the as-formed coating material. As noted below, very smooth edges can be formed upon development of the coating material with the removal of the un-irradiated coating material or alternatively with selective removal of the irradiated coating material.

Radiation generally can be directed to the coated substrate through a mask or a radiation beam can be controllably scanned across the substrate. In general, the radiation can comprise electromagnetic radiation, an electron-beam (beta radiation), or other suitable radiation. In general, electromagnetic radiation can have a desired wavelength or range of wavelengths, such as visible radiation, ultraviolet radiation or x-ray radiation. The resolution achievable for the radiation pattern is generally dependent on the radiation wavelength, and a higher resolution pattern generally can be achieved with shorter wavelength radiation. Thus, it can be desirable to use ultraviolet light, x-ray radiation or an electron-beam to achieve particularly high resolution patterns.

Following International Standard ISO 21348 (2007) incorporated herein by reference, ultraviolet light extends between wavelengths of greater than or equal 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm A 193 nm line from an argon fluoride laser can be used as a radiation source in the FUV. EUV light has been used for lithography at 13.5 nm, and this light is generated from a Xe or Sn plasma source excited using high energy lasers or discharge pulses. Soft x-rays can be defined from greater than or equal 0.1 nm to less than 10 nm.

The amount of electromagnetic radiation can be characterized by a fluence or dose which is defined by the integrated radiative flux over the exposure time. Suitable radiation fluences can be from about 1 $mJ/cm^2$ to about 175 $mJ/cm^2$, in further embodiments from about 2 $mJ/cm^2$ to about 150 $mJ/cm^2$, and in further embodiments from about 3 $mJ/cm^2$ to about 125 $mJ/cm^2$. A person of ordinary skill in the art will recognize that additional ranges of radiation fluences within the explicit ranges above are contemplated and are within the present disclosure.

Based on the design of the coating material, there can be a large contrast of material properties between the irradiated regions that have condensed coating material and the un-irradiated, coating material with substantially intact organic or carboxylate ligands. For embodiments in which a post irradiation heat treatment is used, the post-irradiation heat treatment can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure. This high contrast in material properties further facilitates the formation of high-resolution lines with smooth edges in the pattern following development as described in the following section.

For the negative tone imaging, the developer can be an organic solvent, such as the solvents used to form the precursor solutions. In general, developer selection can be influenced by solubility parameters with respect to the coating material, both irradiated and non-irradiated, as well as developer volatility, flammability, toxicity, viscosity and potential chemical interactions with other process material. In particular, suitable developers include, for example, alcohols (e.g., 4-methyl-2-pentanol, 1-butanol, isopropanol, 1-propanol, methanol), ethyl lactate, ethers (e.g., tetrahydrofuran, dioxane, anisole) and the like. The development can be performed for about 5 seconds to about 30 minutes, in further embodiments from about 8 seconds to about 15 minutes and in addition embodiments from about 10 seconds to about 10 minutes. A person of ordinary skill in the art will recognize that additional ranges within the explicit ranges above are contemplated and are within the present disclosure.

In addition to the primary developer composition, the developer can comprise additional compositions to facilitate the development process. Suitable additives may include, for example, viscosity modifiers, solubilization aids, or other processing aides. If the optional additives are present, the developer can comprise no more than about 10 weight percent additive and in further embodiments no more than about 5 weight percent additive. A person of ordinary skill in the art will recognize that additional ranges of additive concentrations within the explicit ranges above are contemplated and are within the present disclosure.

With a weaker developer, e.g., lower concentration aqueous developer, diluted organic developer or compositions in which the coating has a lower development rate, a higher temperature development process can be used to increase the rate of the process. With a stronger developer, the temperature of the development process can be lower to reduce the rate and/or control the kinetics of the development. In general, the temperature of the development can be adjusted between the appropriate values consistent with the volatility of the solvents. Additionally, developer with dissolved coating material near the developer-coating interface can be dispersed with ultrasonication during development.

The developer can be applied to the patterned coating material using any reasonable approach. For example, the developer can be sprayed onto the patterned coating material. Also, spin coating can be used. For automated processing, a puddle method can be used involving the pouring of the developer onto the coating material in a stationary format. If desired spin rinsing and/or drying can be used to complete the development process. Suitable rinsing solutions include, for example, ultrapure water, methyl alcohol, ethyl alcohol, propyl alcohol and combinations thereof. After the image is developed, the coating material is disposed on the substrate as a pattern.

After completion of the development step, the coating materials can be heat treated to further condense the material and to further dehydrate, densify, or remove residual developer from the material. This heat treatment can be particularly desirable for embodiments in which the oxide coating material is incorporated into the ultimate device, although it may be desirable to perform the heat treatment for some embodiments in which the coating material is used as a resist and ultimately removed if the stabilization of the coating material is desirable to facilitate further patterning. In particular, the bake of the patterned coating material can be performed under conditions in which the patterned coating material exhibits desired levels of etch selectivity. In some embodiments, the patterned coating material can be heated to a temperature from about 100° C. to about 600° C., in further embodiments from about 175° C. to about 500° C. and in additional embodiments from about 200° C. to about 400° C. The heating can be performed for at least about 1 minute, in other embodiment for about 2 minutes to about 1 hour, in further embodiments from about 2.5 minutes to about 25 minutes. The heating may be performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure. Likewise, non-thermal treatments, including blanket UV exposure, or exposure to an oxidizing plasma such as 02 may also be employed for similar purposes.

In some embodiments, adjacent linear segments of neighboring structures can have an average pitch (half-pitch) of no more than about 60 nm (30 nm half-pitch), in some embodiments no more than about 50 nm (25 nm half-pitch) and in further embodiments no more than about 34 nm (17 nm half-pitch). Pitch can be evaluated by design and confirmed with scanning electron microscopy (SEM), such as with a top-down image. As used herein, pitch refers to the spatial period, or the center-to-center distances of repeating structural elements, and as generally used in the art a half-pitch is a half of the pitch. Feature dimensions of a pattern can also be described with respect to the average width of the feature, which is generally evaluated away from corners or the like. Also, features can refer to gaps between material elements and/or to material elements. In some embodiments, average widths can be no more than about 25 nm, in further embodiments no more than about 20 nm, and in additional embodiments no more than about 15 nm. A person of ordinary skill in the art will recognize that additional ranges of pitch and average widths within the explicit ranges above are contemplated and are within the present disclosure. Based on these processes, the patterning can be adapted to the formation of various devices such as electronic integrated circuits, generally through the repeated patterning process to form appropriately layered structures, such as transistors or other components.

Wafer throughput is a substantially limiting factor for implementation of EUV lithography in high-volume semiconductor manufacturing, and is directly related to the dose required to pattern a given feature. However, while chemical strategies exist to reduce imaging dose, a negative correlation between the imaging dose required to print a target feature, and feature size uniformity (such as LWR) is commonly observed for EUV photoresists at feature sizes and pitches<50 nm, thereby limiting final device operability and wafer yields. Patterning capability can be expressed in terms of the dose-to-gel value. Imaging dose requirements can be evaluated by forming an array of exposed pads in which the exposure time is stepped from pad to pad to change the dosing of the exposure. The film can then be developed, and the thickness of the remaining resist can be evaluated for all of the pads, for example, using spectroscopic elipsometry. The measured thicknesses can be normalized to the maximum measured resist thickness and plotted versus the logarithm of exposure dose to form characteristic curves. The maximum slope of the normalized thickness vs log dose curve is defined as the photoresist contrast (γ) and the dose value at which a tangent line drawn through this point equals 1 is defined as the photoresist dose-to-gel, ($D_g$). In this way common parameters used for photoresist characterization may be approximated following Mack, C. *Fundamental Principles of Optical Lithography*, John Wiley & Sons, Chichester, U.K; pp 271-272, 2007.

EXAMPLES

Example 1. Preparation of Trimer (t-Bu)$_3$Sn$_3$ (O$_2$CH)$_5$(OH)$_2$O

This example demonstrates the synthesis of the tin cluster composition.

A reactant for the cluster formation was first synthesized. A 3-L round-bottom flask is equipped with a magnetic stirbar and a thermometer and purged with nitrogen. An aqueous acetic acid bubbler is attached to the flask to collect dimethylamine outgassing. The flask is then charged with 505 g phenylacetylene and 1 L of hexane. While stirring vigorously, 462 g of tert-butyltin tris(dimethylamide) is added and the temperature is maintained below 50 C. Through addition, rapid outgassing of amine occurs. Upon completion, the stirring is stopped and the flask is left to crystallize overnight. The crystals of tertbutyltin tri(phenylacetylide) are collected and recrystallized in hexanes (698.6 g/97.2% yield).

A 500 mL round-bottom flask equipped with a magnetic stirrer was charged with 50 g of the synthesized tertbutyltin tri(phenylacetylide), 375 mL absolute ethanol, 125 mL 92% formic acid (8% water), and an additional 5 mL deionized water. The solution in the round bottom flask was heated to 60° C. for 10 minutes or until the acetylide dissolved, then stirred at room temperature overnight. After the overnight reaction, the solvent was distilled under vacuum. Following removal of the solvent, the recovered solid was recrystallized by dissolving the solid in 500 mL of hot toluene (80° C.) then allowing the solution to slowly cool to 25° C. Colorless crystals were collected by filtration (82% Yield).

The colorless crystals were characterized using x-ray diffraction, differential scanning calorimetry, NMR, and electrospray ionization mass spectrometry. Characterization of the composition is presented in FIGS. 1-6. FIG. 1 is the estimated crystal structure of the crystalline product obtained by x-ray diffraction with the Bruker™ SHELXL-2014 package (Bruker Corporaton), see Sheldrik, G. M. (2008) Acta. Crst. A64, 112-122. The structure shows a $\mu_3$-O atom bridging between the three tin atoms. Each tin atom has a t-butyl ligand, and three bridging formate ions connect each pair of tin atoms. Two OH groups bridge between one tin atom and the other tin atom, which results in two equivalent tin atoms and one distinguishable tin atoms. Two non-bridging formate ions are ligands to the two equivalent tin atoms. The NMR results below are consistent with two tin atoms being equivalent and one tin atom being distinct in the crystalline environment.

Figure 2:
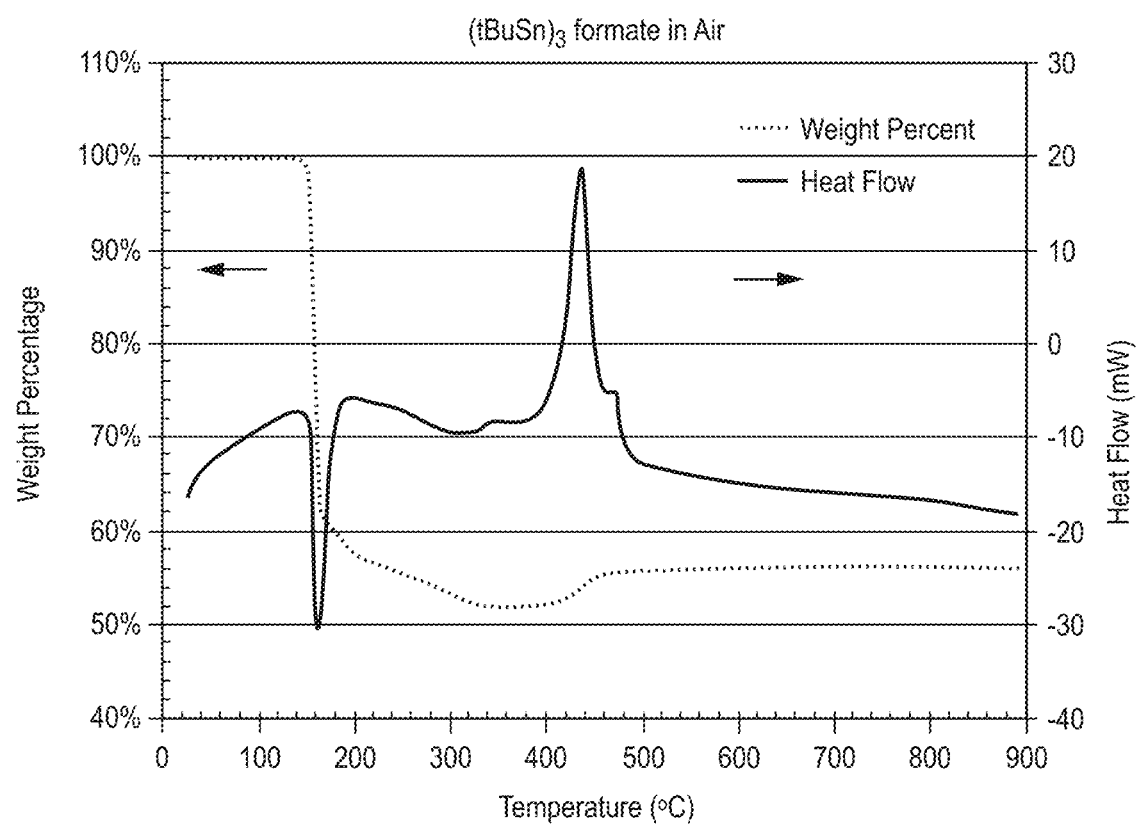
FIG. 2 is a plot depicting the thermogravimetric analysis of $((CH_3)_3C)_3Sn_3(O_2CH)_5(OH)_2(\mu_3-O)$ showing conversion to $SnO_2$ in air, in which plots of weight and heat flow are presented as a function of temperature.
Figure 3:
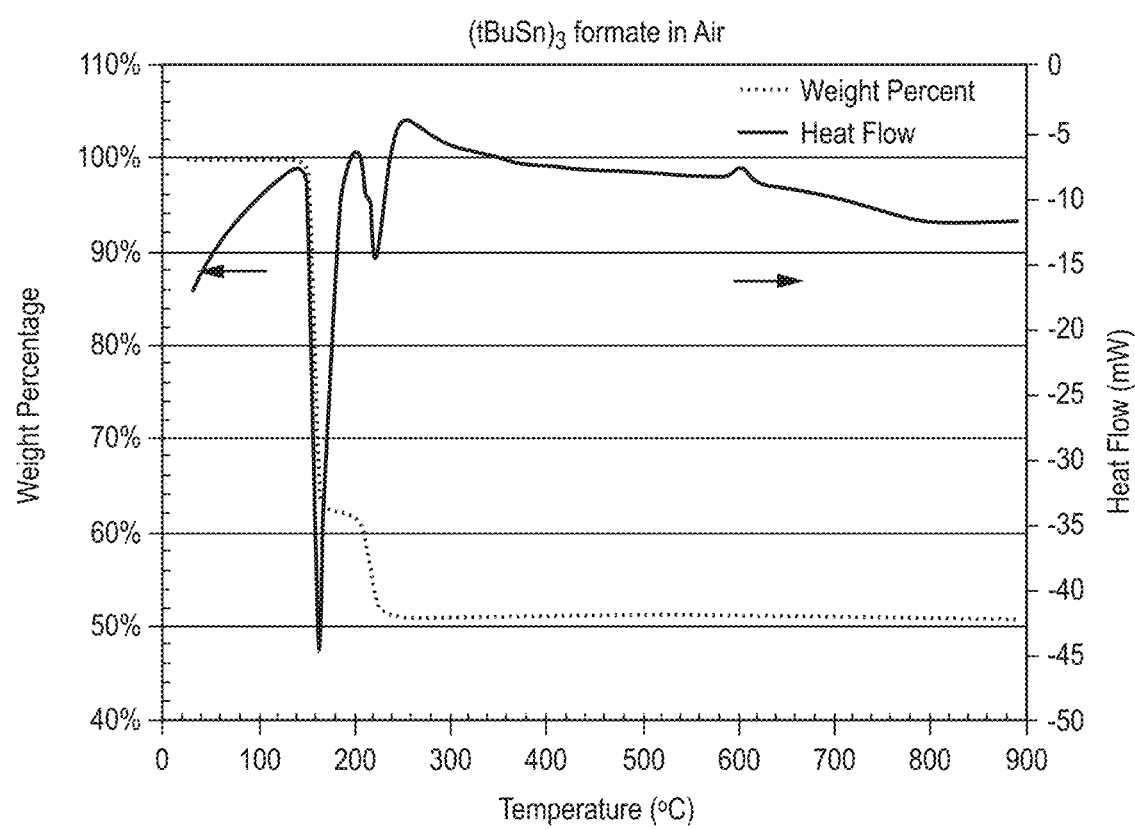
FIG. 3 is a plot depicting the thermogravimetric analysis of $((CH_3)_3C)_3Sn_3(O_2CH)_5(OH)_2(\mu_3-O)$ showing conversion to SnO in argon, in which plots of weight and heat flow are presented as a function of temperature.

FIGS. 2 and 3 are differential scanning calorimetry measurements of the crystals. The thermogravametric analysis in FIG. 2 was obtained with an ambient air atmosphere, and the thermogravimetric analysis in FIG. 3 was obtained over argon gas. FIG. 2 demonstrates the eventual formation of SnO$_2$, and FIG. 3 demonstrates the eventual formation of SnO, which are evaluated according to the final weights. The results also provide the heat flow results that indicate several thermal steps in the process to reach the final product.

Figure 4:
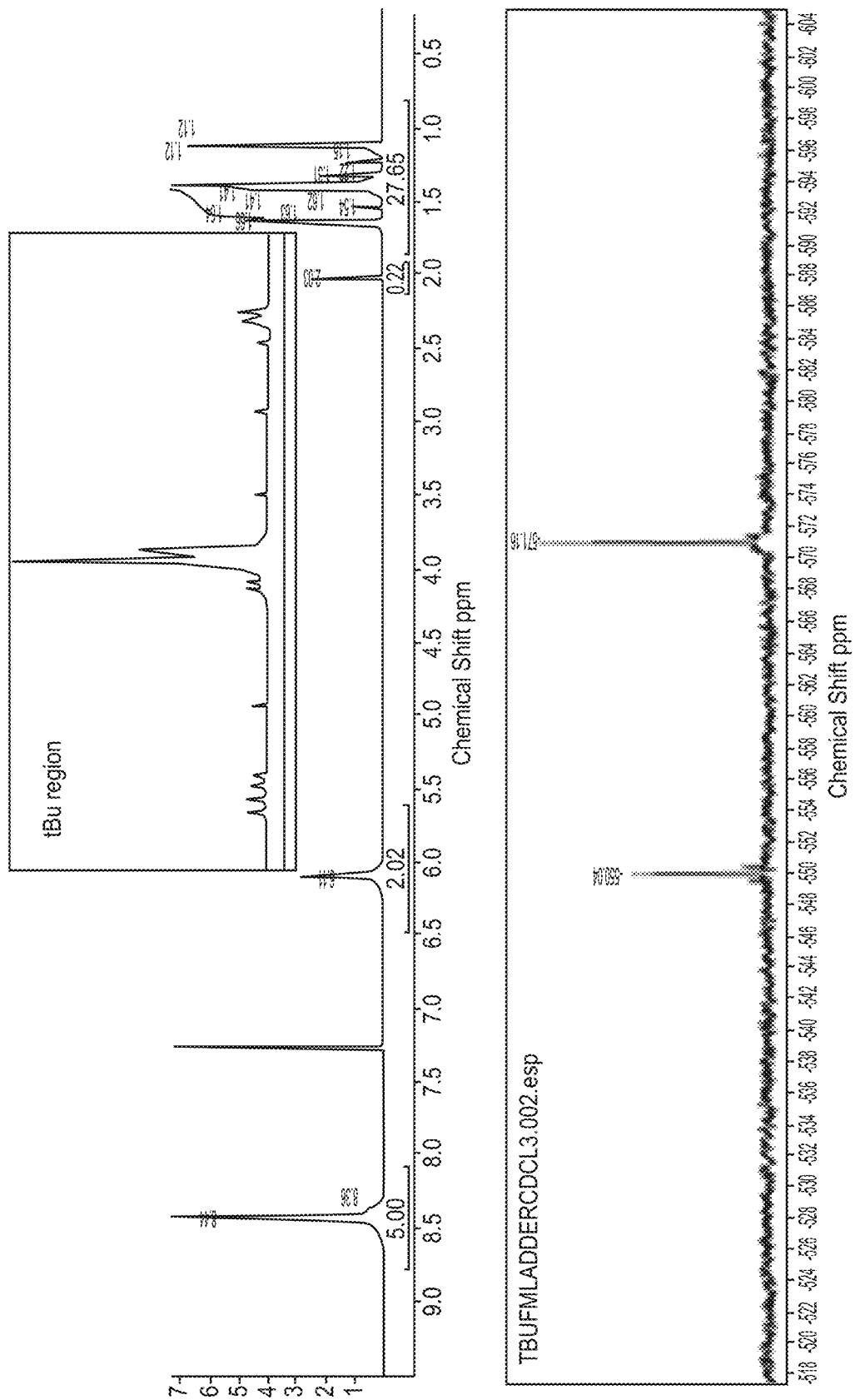
FIG. 4 is a set of plots of spectra for $^1H$ and $^{119}Sn$ NMR for $((CH_3)_3C)_3Sn_3(O_2CH)_5(OH)_2(\mu_3-O)$ in $CDCl_3$.

For the NMR spectra in FIG. 4, $^1$H and $^{119}$Sn channels were taken with a 500 MHz Bruker-Ascend NMR spectrometer using a 5 mm BBOF probe. The data was analyzed using MestReNova v.12 NMR software. The tin spectrum shows two resonances at −550 and −571 ppm with a 1:2 integration indicating two tin environments and three total tin (or a factor of three). The proton NMR spectrum shows a broad hump at 8.44 ppm for the formate protons and another broad hump at 6.11 ppm for the hydroxyl protons. The peaks at 1.6 and 1.1 ppm are $^{119/117}$Sn satellites to the tert-Butyl peaks at 1.4 ppm. The exact shift of these peaks is sensitive to water levels in the solvent, suggesting interaction with water.

Figure 5:
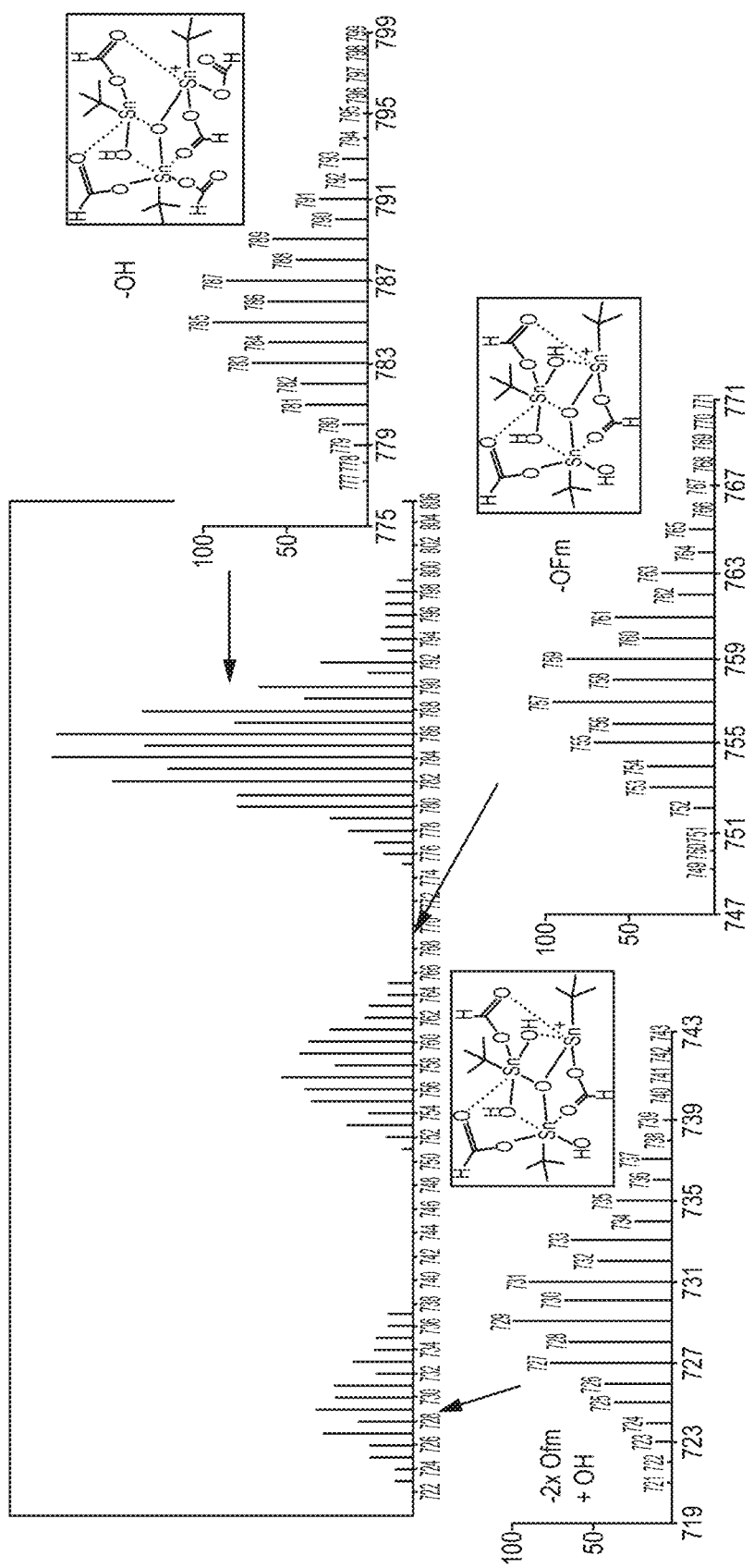
FIG. 5 is an electrospray ionization mass spectrum (ESI-MS) of $Sn_3$ trimers $((CH_3)_3C)_3Sn_3(O_2CH)_5(OH)_2(\mu_3-O)$ in tetrahydrofuran-25% formic acid solvent, in which expanded inserted plots are shown for dominant fragment ions.
Figure 6:
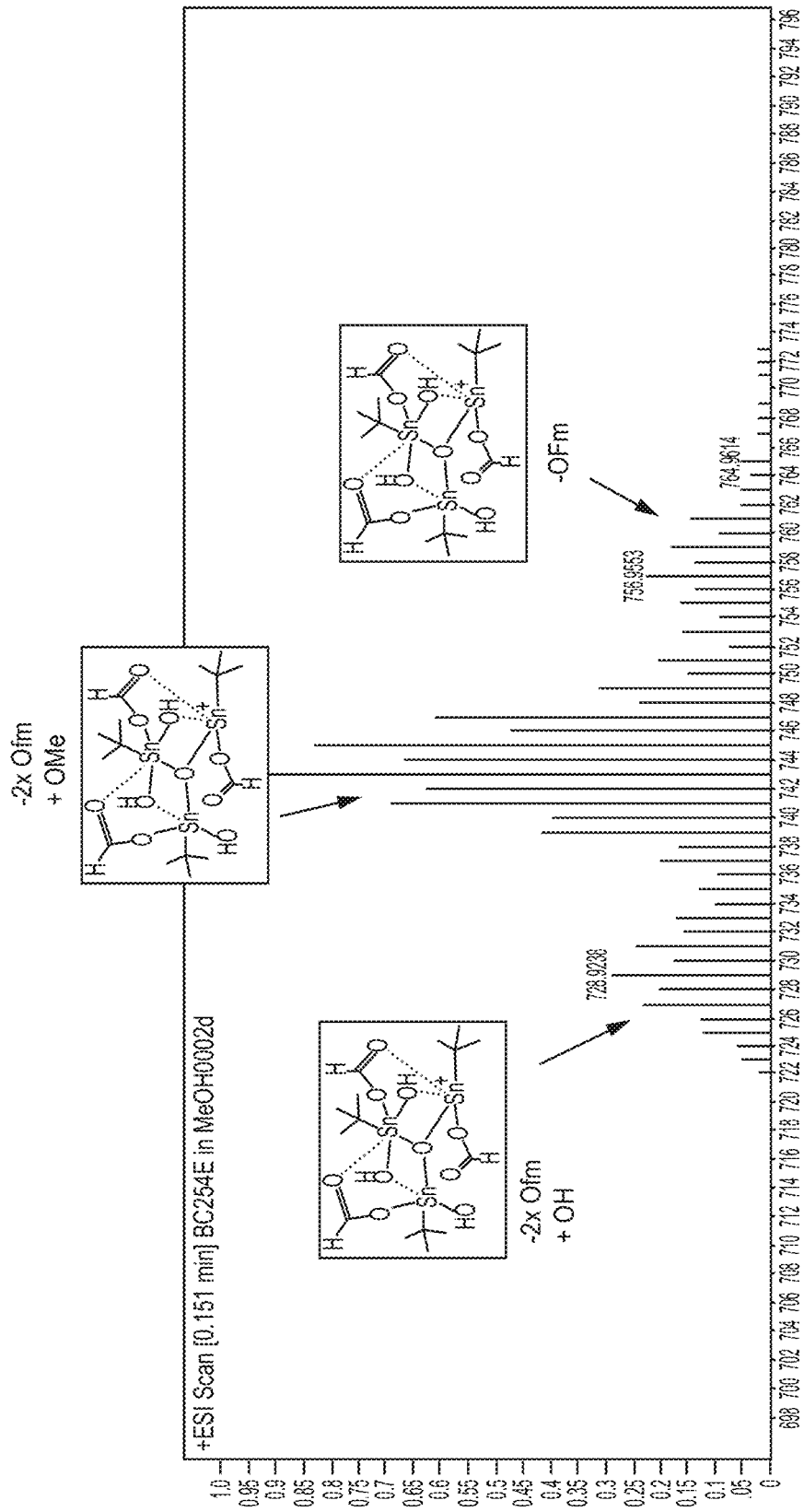
FIG. 6 is an ESI-MS spectrum of $Sn_3$ trimers $((CH_3)_3C)_3Sn_3(O_2CH)_5(OH)_2(\mu_3-O)$ in methanol solvent, in which expanded inserted plots are shown for dominant fragment ions.
Figure 7:
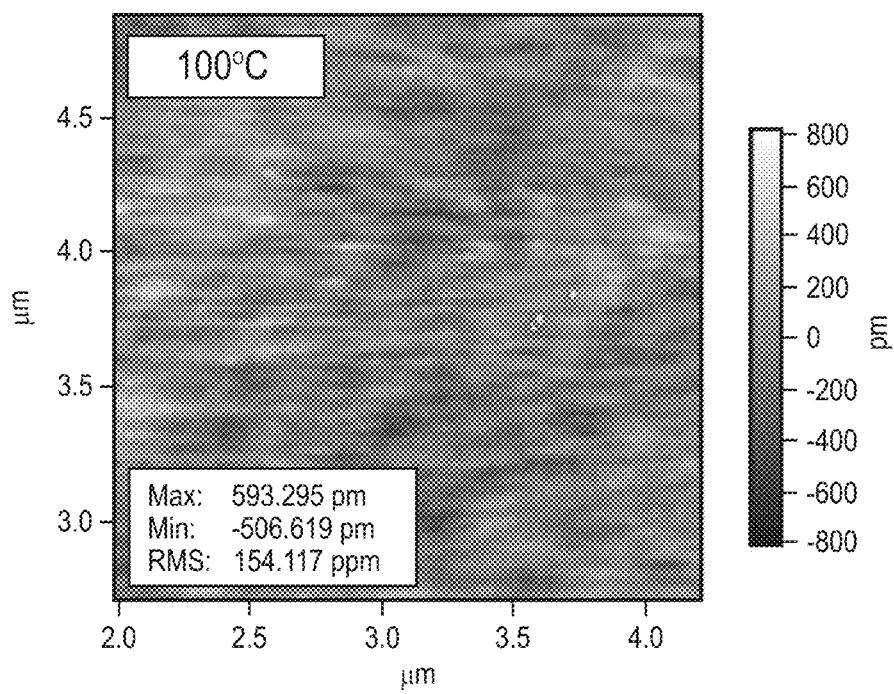
FIG. 7 is an atomic force microscopy scan of a radiation sensitive film prior to irradiation, formed with $((CH_3)_3C)_3Sn_3(O_2CH)_5(OH)_2(\mu_3-O)$ precursor solutions with pre-irradiation bake at 100° C., along with evaluation of root mean square (RMS) surface roughness.

FIGS. 5 and 6 are electrospray ionization mass spectra of the product tin trimer obtained from solution. FIG. 5 was obtained from a solution of tetrahydrofuran-25% formic acid solvent at 1 mM tin, and FIG. 6 was obtained from a methanol solution at 1 mM tin. Both figures were collected on an Agilent 1200 LC liquid chromatograph configured with an autoinjector then run directly into a Agilent ESI-QTOF 6510. Both spectra suggest rapid exchange between the two non-bridging formates with either water or methanol.

Example 2. Preparation of Coated Wafers

This Example described the preparation of coated wafers for EUV patterning.

The crystalline tin trimer from Example 1 was dissolved in a mixed solvent of 95% anhydrous anisole and 5% formic acid (99% formic acid with 1% water) at a concentrations in the range of 1.9 to 9.4 mM. Molarity is referenced to tin atoms and not to moles of trimer, which is conventional in this field.

Radiation sensitive films were deposited onto silicon wafers by spin coating solutions in air of tin trimer in 5% formic acid/anisole with a tin concentration of 8.6 mM at 1500 rpm for 45 s to a thickness of 25 nm. Four coated wafers were subjected to a pre-exposure bake at either 100° C., 120° C., 150° C. or 180° C. for 60 seconds. After the bake, the films were examined with atomic force microscopy (AFM), and values of root mean square surface roughness were found to be from 0.16 nm to 12 nm. The AFM results are presented in FIGS. 7-10 for the 4 bake temperatures listed above. Films were atomically smooth for bake temperatures of 100° C. or 120° C. Grain growth was observed for films baked at higher temperatures, leading to film surface roughness.

Example 3. Film Exposure and EUV Contrast

This example is directed to evaluating the contrast curve for the prepared radiation sensitive films.

Figure 8:
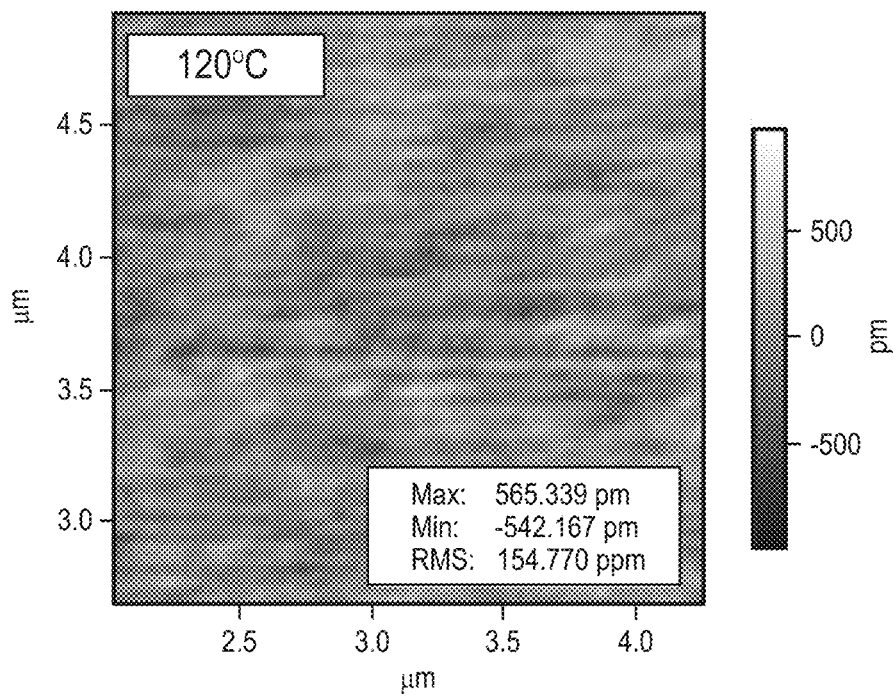
FIG. 8 is an atomic force microscopy scan of a radiation sensitive film prior to irradiation, formed with $((CH_3)_3C)_3Sn_3(O_2CH)_5(OH)_2(\mu_3-O)$ precursor solutions with pre-irradiation bake at 120° C., along with evaluation of root mean square (RMS) surface roughness. 150° C. or 180° C.

A set of coated wafers with radiation sensitive films were prepared as described above. The films were exposed on the EUV Direct Contrast Tool (13.5 nm) at Lawrence Berkeley National Laboratory to assess contrast. Prior to exposure, the films were baked at 80° C. for 60 seconds. Selected areas of each wafer were exposed with increasing doses. Specifically, an array of pads had exposure times that were modulated to step the delivered EUV dose for each pad along the array. After exposure, the films of different wafers were baked (post-exposure bake) at selected temperatures between 80° C. and 150° C., and then after baking the exposed wafers were developed with 2-heptanone. The residual thickness of each exposed pad on the wafer after development was assessed via spectroscopic ellipsometry. The measured thicknesses were normalized to the maximum measured resist thickness and plotted versus the logarithm of exposure dose to form characteristic curves for each resist at a series of post exposure bake temperatures. FIG. 8 shows the resulting contrast curves for each post-exposure bake temperature.

Example 4. Negative Tone Imaging with EUV Exposure

This example demonstrates the ability to form a high resolution pattern using the tin cluster precursors.

Figure 9:
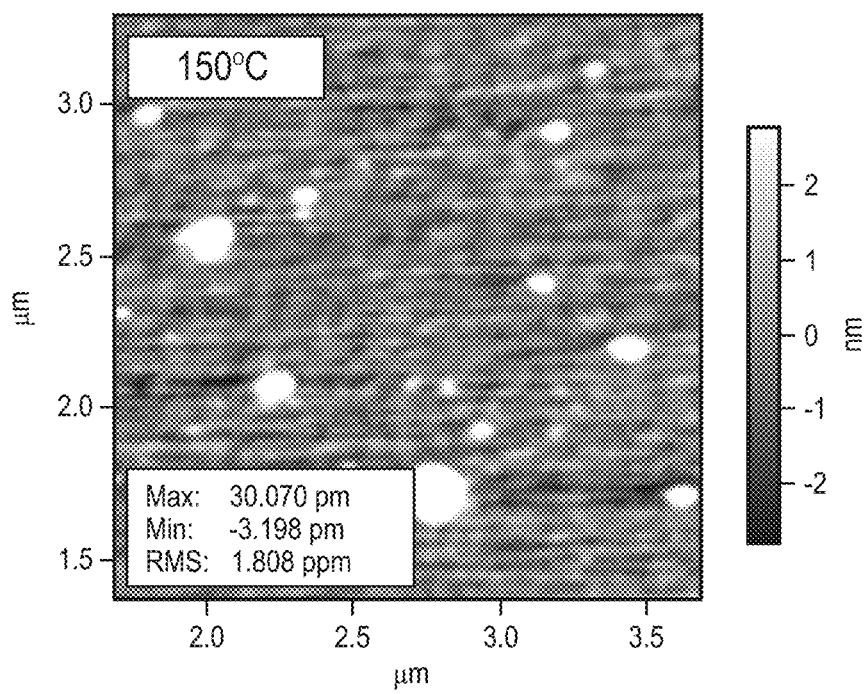
FIG. 9 is an atomic force microscopy scan of a radiation sensitive film prior to irradiation, formed with $((CH_3)_3C)_3Sn_3(O_2CH)_5(OH)_2(\mu_3-O)$ precursor solutions with pre-irradiation bake at 150° C., along with evaluation of root mean square (RMS) surface roughness.
Figure 10:
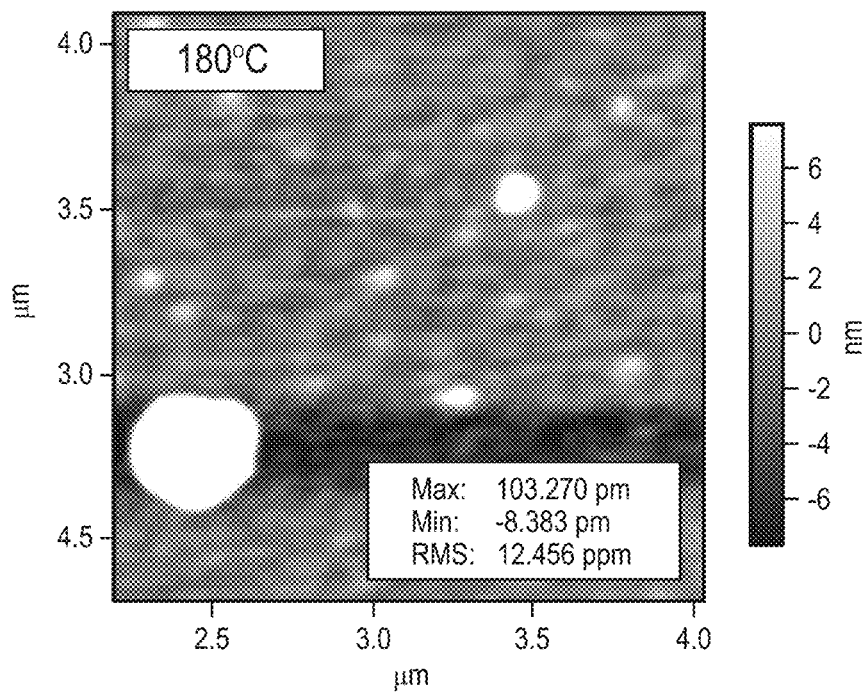
FIG. 10 is an atomic force microscopy scan of a radiation sensitive film prior to irradiation, formed with $((CH_3)_3C)_3Sn_3(O_2CH)_5(OH)_2(\mu_3-O)$ precursor solutions with pre-irradiation bake at 180° C., along with evaluation of root mean square (RMS) surface roughness.
Figure 11:
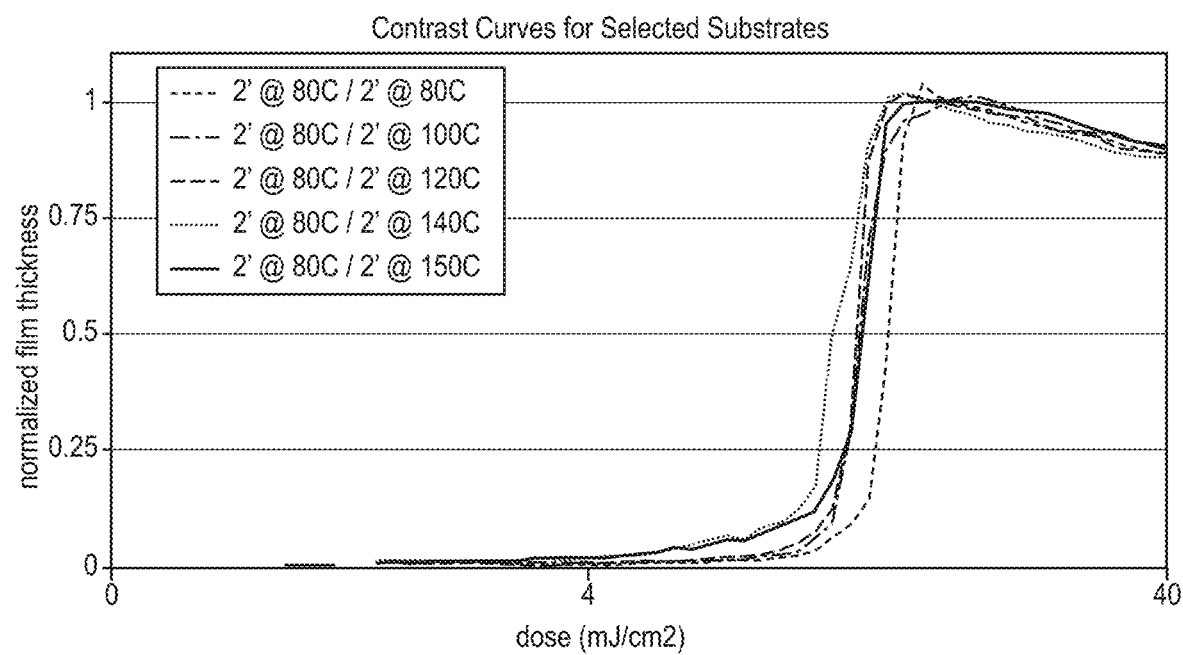
FIG. 11 is a plot of five contrasts curves with normalized film thickness plotted as a function of EUV dose, in which the radiation sensitive films were subjected to one of five post-irradiation bake temperatures prior to development.
Figure 12:
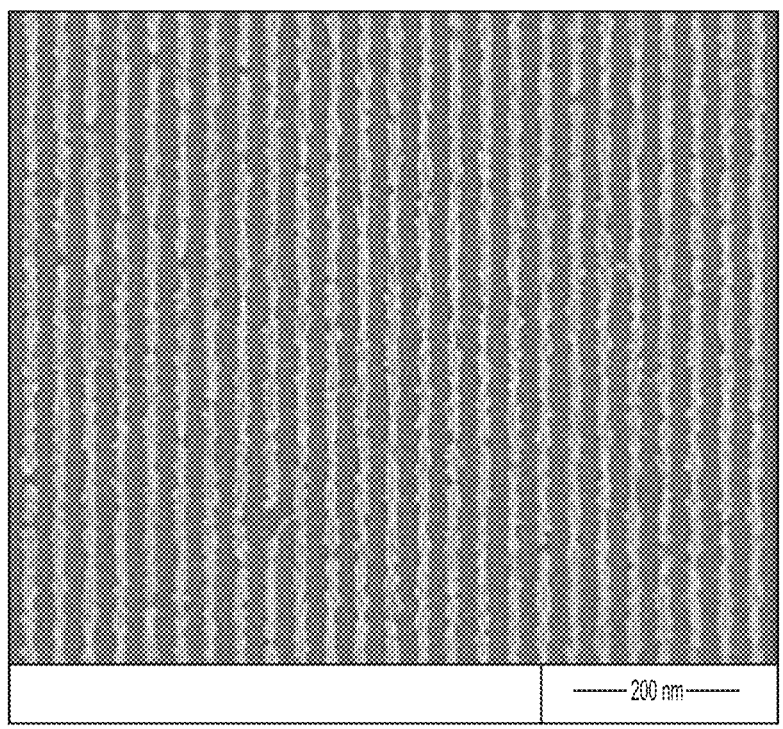
FIG. 12 is a scanning electron micrograph of a patterned resist with lines as a 36 nm pitch after irradiation with an EUV dose of 100 mJ/cm² and development.

The 5% formic acid/anisole resist precursor solution described in Examples 2 and 3 was dispensed onto silicon substrates with a native oxide surface, spin-coated for 45 s at 1500 rpm, and then baked on a hotplate for 120 s at 100° C. The coated substrates were exposed on the Berkeley Microfield Exposure Tool with 13.5-nm wavelength radiation, dipole illumination, and a numerical aperture of 0.3. The exposed resist and substrate were then subjected to a post-exposure bake on a hotplate for 120 s at 170° C. The exposed wafer was dipped in 2-heptanone for 15 s to remove unexposed portions of the resist, then dried. FIG. 9 shows an SEM image of the resulting line/space pattern at 36-nm pitch. Thus, the cluster based resist material has been demonstrated to be suitable for nanometer scale EUV patterning.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. A method for synthesizing a tin tri(acetylide) having the formula $RSn(C \equiv CR'')_3$, the method comprising:
   in an organic solvent, reacting a compound having the formula $HC \equiv CR''$ with a tin tri(diamide) having the formula $RSn(NR'''_2)_3$ to form a tin tri(acetylide), having the formula $RSn(C \equiv CR'')_3$,
   wherein R is a hydrocarbyl group having from 1 to 31 carbon atoms or a hydrocarbyl group substituted with a heteroatom functional group and/or a halogenated group or substituted with combinations thereof, wherein R" and R'" are independently a hydrocarbyl group having from 1 to 31 carbon atoms, wherein R is bound to the tin atom.

2. The method of claim 1 wherein R is a linear alkyl group, a branched alkyl group, an olefinic group, an alkynyl group, a cycloalkyl group, a derivative thereof substituted with a hetero-atom functional group and/or a halogenated group, or combinations thereof and wherein R" is a linear alkyl group or a branched alkyl group.

3. The method of claim 1 wherein R is a methyl, ethyl, i-propyl, n-butyl, s-butyl, t-butyl, t-amyl, neopentyl group, or combination thereof.

4. The method of claim 2 wherein R is t-butyl and/or wherein R" is a cyclic alkyl group, an unsaturated alkyl group, or an aromatic alkyl group having no more than 15 carbon atoms.

5. The method of claim 1 wherein the tin tri(diamide) comprises t-butyltin tri(dimethylamide).

6. The method of claim 1 wherein the acetylene comprises phenylacetylene.

7. The method of claim 1 wherein the organic solvent comprises hexane.

8. The method of claim 1 wherein the acetylene comprises phenylacetylene, the tin tri(diamide) comprises t-butyltin tri(dimethylamide), the organic solvent comprises hexane, and the tin tri(acetylide) comprises t-butyltin tri(phenylacetylide).

9. The method of claim 1 wherein the reaction temperature is maintained below 50° C. and a vapor dialkylamine is removed from the reaction.

10. The method of claim 1 wherein a crystalline tin tri(acetylide) having the formula $RSn(C \equiv CR'')_3$ is collected.

11. The method of claim 1 wherein R comprises N, S, Si, O, and/or halogen atoms.

* * * * *